United States Patent [19]

Guy

[11] Patent Number: 5,047,720
[45] Date of Patent: Sep. 10, 1991

[54] CORRECTION DEVICE USING MAGNETIC ELEMENTS FOR CORRECTING UNHOMOGENEITIES OF THE MAGNETIC FIELD IN A MAGNET

[75] Inventor: Aubert Guy, Grenoble, France

[73] Assignee: Centre National De La Recherche Scientifique, Paris, France

[21] Appl. No.: 432,762

[22] PCT Filed: Dec. 23, 1987

[86] PCT No.: PCT/FR87/00512
§ 371 Date: Aug. 2, 1989
§ 102(e) Date: Aug. 2, 1989

[87] PCT Pub. No.: WO88/05167
PCT Pub. Date: Jul. 14, 1988

[30] Foreign Application Priority Data

Dec. 30, 1986 [FR] France .................................. 8618358

[51] Int. Cl.$^5$ ............................................ G01R 33/20
[52] U.S. Cl. ............................................... 324/320
[58] Field of Search ............... 324/300, 307, 309, 318, 324/319, 320, 322; 335/301

[56] References Cited

U.S. PATENT DOCUMENTS 3,905,417 9/1975 Delassus ............................ 335/300
4,511,870 4/1985 Caillat ................................ 335/213
4,743,853 5/1988 Frese .................................. 324/320

FOREIGN PATENT DOCUMENTS 0151036 8/1985 European Pat. Off. .
0222281 5/1987 European Pat. Off. .
61-264242 11/1986 Japan .

OTHER PUBLICATIONS

Patent Abstracts of Japan, vol. 9, No. 174 (P-374) (1987) Jul. 19, 1985, & JP, A, 60-50442 (Yokokawa Medical System K.K.) Mar. 20, 1985.

Primary Examiner—Michael J. Tokar
Attorney, Agent, or Firm—Oblon, Spivak, McClelland, Maier & Neustadt

[57] ABSTRACT

Corrector device for correcting unhomogeneities of the magnetic field produced by a magnet, said device applying a principle of correction of the field by means of one of a plurality of magnetic elements in a manner which is much simpler and quicker than in the prior art. To this effect, the corrector device of the invention comprises premachined openings which are intended to house a magnetic element and comprises means to maintain confound a longitudinal axis of the magnetic element and a longitudinal axis of the opening, independently of the value of the cross-section of the magnetic element.

17 Claims, 2 Drawing Sheets

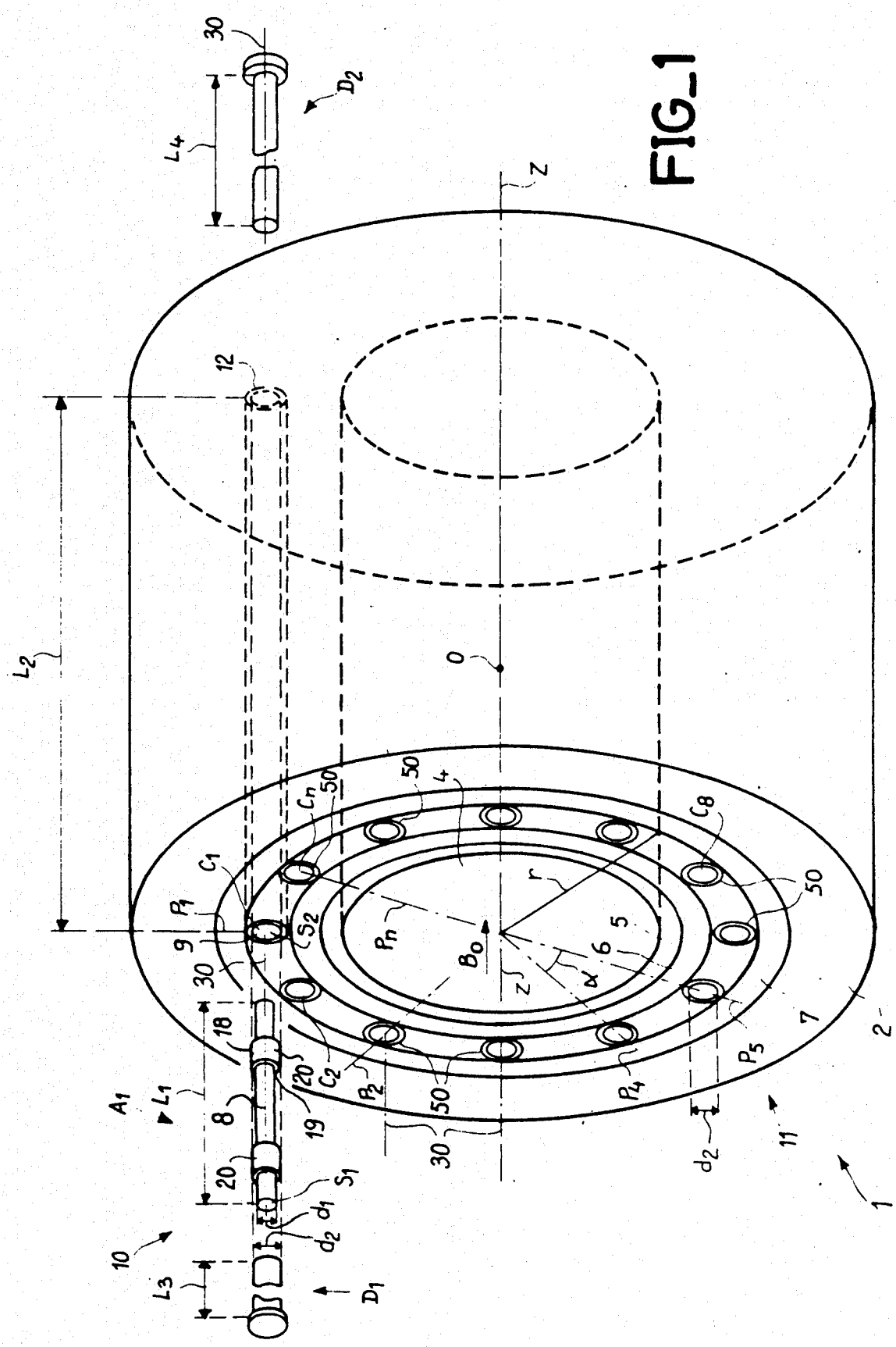
FIG_1

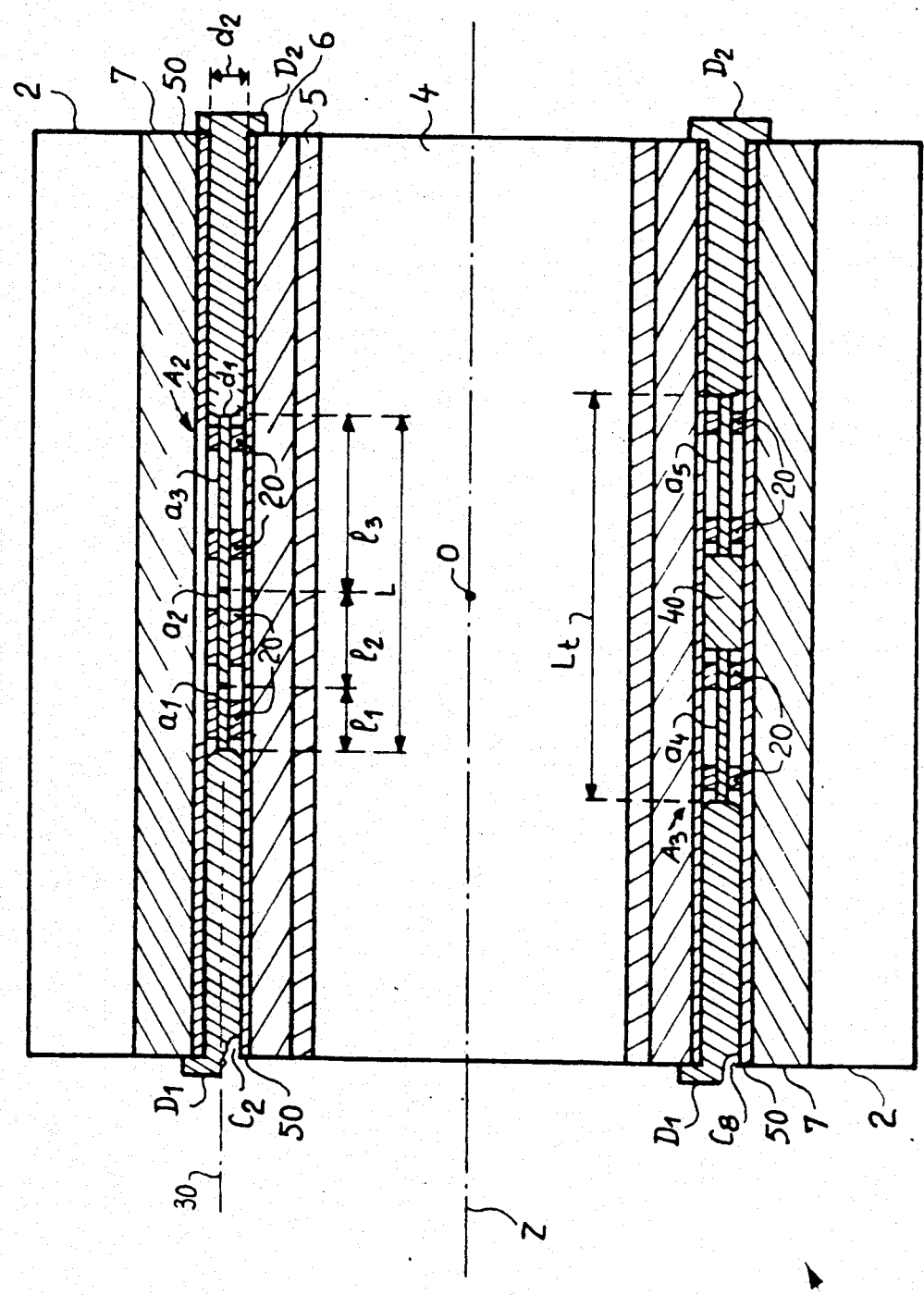

CORRECTION DEVICE USING MAGNETIC ELEMENTS FOR CORRECTING UNHOMOGENEITIES OF THE MAGNETIC FIELD IN A MAGNET

The present invention is due to the collaboration of the Service National des Champs Intenses (Director, Mr. Guy Aubert), and its object is a correction device using magnetic elements to correct unhomogeneities of the magnetic field produced by a magnet. It particularly concerns means for the assembly and positioning of one or more of these magnetic elements. The invention can be applied especially in the medical field where magnets are used in methods of nuclear magnetic resonance imaging. However, it can find application in other fields, notably in that of scientific research, where intense fields produced by magnets are used.

Magnetic resonance is a phenomenon of oscillation of the magnetic moment of the nuclei of the atoms or molecules of a body, at a frequency that depends on the intensity of a magnetic field in which this body is bathed. It follows that if the intensity of the magnetic field varies, the frequency of the phenomenon of resonance varies too. Hence, for technological and technical reasons, it is of the utmost importance that the field produced by the magnet should be very homogeneous in its zone of interest. The requisite homogeneity is usually of the order of some parts per million in the medical field, or even some parts per billion (1000,000,000) in the scientific field. To achieve this end, it is sought to construct magnets with a field that is as perfectly homogeneous as possible.

Unfortunately, irrespectively of the care that might be taken in constructing the magnets, they are never as perfect as the theory that has led to their design. Besides, even if this fault can be eliminated, the magnet to be used should be placed physically in a given location. Now, none of the regions of space, in an industrial or urban environment, is totally free of magnetically disturbing elements. The result thereof is that once the magnet is installed on the site, the field that it produces in a zone of interest has non-homogeneities which must be corrected.

The principle of the correction of non-homogeneities of the fields is that of superimposition: coils, magnetic pieces, or any other means enabling a correction of the imperfections of the main field and the obtaining of a homogeneous total field in the zone of interest are added on. A known method to correct the non-homogeneities of the magnetic field produced by a magnet consists in the use of magnetic elements such as magnetizable bars, for example made of soft iron, which are placed in the environment of the magnet and exert their influence in a zone of interest of the magnet so as to correct the non-homogeneities of the field in this zone.

A method of this type is commented on in an article by D. I. Hoult and D. Lee, "Shimming a Superconducting Nuclear Magnetic Resonance Imaging Magnet With Steel" in Revue Sci. Instrum., January 1985, pp. 131 to 135. This article concerns, particularly, a nuclear magnetic resonance imaging apparatus. The magnet has the shape of a circular cylinder, within which the zone of interest is located. The center of this zone of interest is placed on the axis of the magnet. The magnetic field produced by the magnet is within this magnet, substantially parallel to the axis of the magnet. This document gives a detailed description of a method of computation which can be used to determine the dimensions and position of one or more magnetic bars, made of soft steel, around the axis of the magnet, as a function of a point of the volume of interest where a non-homogeneity of the field has to be corrected. The length of these correction bars is parallel to the axis of the magnet.

A method such as this, despite its relative complexity, enables the efficient correction of the possible non-homogeneities of the magnetic field in the volume of interest, by the placing of one or more magnetic bars, for which the section, length and position with respect to the volume of interest are determined on the basis of computations that are known and are, for example, of the type indicated notably in the above-mentioned article. But, as known, this method has the drawback of being hard to apply in the context of the industrial scale fabrication of magnets. In effect, especially in view of, firstly, manufacturing tolerances which may introduce differences, between one magnet and another, in the magnetic fields produced by these magnets and, secondly, in view of elements which, on the site of their installation, could disturb the magnetic field, it is necessary to redefine, at the same time, the length, cross section and position of the magnetic correction bars when the magnet is already installed on the site, i.e. the magnetic bars should be cut and positioned to order for each application. The document EP-A-0 222 281 describes a simplification of this problem in that it provides for openings designed to receive longitudinal, magnetic correction elements. However, the positioning of these elements has not been thoroughly considered, so that the correction provided is not as as efficient as desired.

The present invention concerns a device for the correction of non-homogeneities of the magnetic field produced by a magnet, enabling the application of the principle explained above for the correction of the field by one or more magnetic bars and, in particular, it has the object of facilitating the implementation of this principle on the site of installation of the magnet, notably in order to make it applicable in the context of industrial-scale production. This is obtained with the correction device according to the invention by a novel arrangement which is achieved during a stage for the construction or assembly of the magnet and which, firstly, provides for the possible positions of one or more magnetic correction elements or magnetic bars and, secondly, can be easily used on the installation site to adjust the degree of influence of the magnetic bar or bars.

According to the invention, a device for the correction of non-homogeneities of a magnetic field in a magnet, comprising at least one elongated magnetic element, the length and cross section of which are defined according to the correction to be made, a support bearing the magnetic element in an opening in the vicinity of the field to be corrected, is characterized in that the opening is formed by a location reserved during the building of the support, the opening having a cross section and length equal to or greater than, respectively, a maximum length and a maximum cross section of the magnetic element, and in that it further comprises means to keep the longitudinal axis of the magnetic element substantially identical with the longitudinal axis of the opening.

The invention will be better understood from the following description, given as a non-restrictive example, and the two appended figures, of which:

FIG. 1 represents, schematically, through a view in perspective, a nuclear magnetic resonance imaging apparatus incorporating a non-homogeneity correction device according to the invention;

FIG. 2 is a longitudinal sectional view of the MRI apparatus and enables the depiction of the characteristic details of the correction device according to the invention.

FIG. 1 shows a non-restrictive example of an application of a correction device 10, according to the invention, to the correction of field non-homogeneities of a nuclear magnetic resonance imaging or MRI apparatus 1, the depiction of the MRI apparatus 1 being restricted to the elements needed to understand the invention. The MRI apparatus 1 has the general shape of a circular cylinder and comprises a magnet 2, also of a cylindrical shape, the axis Z of which is also the longitudinal axis of the MRI apparatus 1, the magnet 2 being formed, for example, by an arrangement of electrical coils (not shown) of a known type. The magnet 2 produces a magnetic field $B_O$ which is oriented, inside the magnet 2, along the axis Z of the latter. Along the axis Z of the magnet, an inner free space 4 forms a tunnel designed to receive a patient (not shown) to be examined. According to a standard arrangement, the MRI apparatus 1 has different elements around the tunnel 4. These elements appear, in FIG. 1, at one end 11 of the MRI apparatus 1 in several coaxial layers 5, 6, 7, 2: The first layer 5, which is closest to the axis Z of the magnet, represents the place occupied by standard gradient coils or radio-frequency antennas (not shown). The second layer 6, which surrounds the first layer 5, symbolizes the place occupied by standard gradient coils (not shown). In the non-restrictive example described, a third peripheral layer 7 represents the place occupied by field correction coils of a known type (not shown) and the last layer 2 represents the magnet. The correction coils 7 enable corrections to be made in a standard way in the non-homogeneities of the field $B_O$ in the magnet 2, in a zone of interest (not shown), the center 0 of which is on the axis Z of the magnet, in adjusting the intensity of the current that is applied to them. These coils 7 can be used to make very fine corrections but, in certain cases, their efficiency is reduced by the fact that their position is frozen.

The MRI apparatus 1 further includes the correcting device 10, enabling the correction of the non-homogeneities of the field $B_O$ by means of at least one magnetic element A1 which may equally well be of the magnetizable type (temporary magnetization), i.e. made of soft magnetic material such as, for example, of soft ferrite or soft iron, or of the magnetized type (permanent magnet). In the non-restrictive example described, a single magnetic element A1, having the shape of a bar, is shown in FIG. 1. It is designed to be housed in an opening C1 in the MRI apparatus 1 in order to act on the field $B_O$, particularly in the zone of interest which is located in the internal space 4 and which has its center 0 on the axis Z of the magnet. As explained in the rest of the description, the correction device 10 may nonetheless include several openings and several magnetic elements or magnetic bars, especially in the case of an application to an MRI apparatus.

The correction device 10 further includes means 20, D1, D2, enabling precise positioning of the magnetic bar A1, with respect, for example, to the center of interest 0. In the non-restrictive example described, the opening C1 has a longitudinal axis 30, parallel to the axis Z of the magnet, and it is located inside the magnet 2, i.e. between the known type of correction coils represented by the third layer 7 and the second layer 6 which represents the above-mentioned gradient coils, the bar or magnetic element A1 being, in the non-restrictive example described, of the magnetizable type. The MRI apparatus 1 thus forms the support of the bar or magnetic element A1, but the opening C1 could equally well be made at another position, for example externally with respect to the magnet 2, and can be made in a different support (not shown).

According to a characteristic of the invention, the opening C1 is made by construction, i.e. it is formed at a pre-determined position P1 by a location reserved for this purpose during the building of the MRI apparatus 1.

The length L1 and/or the section S1 of the magnetic bar A1 are liable to vary from one magnet to another, depending on the non-homogeneity of the field $B_O$ to be corrected. To take this possibility into account, the opening C1 is given, firstly, a second cross section S2, equal to or greater than the maximum cross section that the magnetic bar A1 may have and, secondly, a second length L2 equal to or greater than the maximum length that a magnetic bar or magnetic element A1 can have.

According to another characteristic of the invention, the positioning means have at least one radial shim 20 in which the magnetic bar A1 is engaged. The radial shim or shims 20 form means to keep the magnetic bar A1 in the opening C1 so that the longitudinal axis 30 of this opening is identical with a longitudinal axis 8 of the magnetic bar A1.

The cross sections S1, S2 of the magnetic bar A1 and the opening C1 may have any shape, for example square or rectangular or circular, as in the example shown in FIG. 1, where the circular section S1 of the magnetic bar A1 has a first diameter d1 smaller than the second diameter d2 of the circular section S2 of the opening C1. The maximum possible section of a magnetic element or bar A1 corresponds to the diameter d2 of the opening C1, and the second length L2 of this opening represents the maximum possible length of a magnetic bar A1. In the non-restrictive example described, the second length L2 of the opening C1 corresponds to the length of the MRI apparatus 1, so that the two ends 9, 12 of the opening C1 are accessible.

The means 20, to keep the longitudinal axes 8, 30 of the magnetic bar A1 and the opening C1 aligned, are made of a material that has no effect on a magnetic field, such as epoxy resins or fiber glass for example. These means can be formed in different ways, the essential point being that the magnetic bar A1 should be kept in the opening C1 so that their respective longitudinal axes 8, 30 are substantially identical, irrespectively of the shapes of the cross sections S1, S2 and, especially, when the section S1 of the magnetic bar A1 is smaller than that of the opening C1. In the non-restrictive example described, these means are formed by radial shims 20, each formed by a circular disc with an axial opening 19 having the same diameter d1 as the magnetic bar used and having an external shape 18, represented by the external diameter, that corresponds to the second diameter d2 of the opening C1.

The positioning means further have longitudinal shims D1, D2, designed to be mounted in the opening C1, on either side of the magnetic bar A1, in order to block this bar in the position that it should occupy along the axis Z of the magnet. Thus, for example, if the length L1 that the bar A1 must have is 0.31 m, and if this length L1 has to be centered with respect to the center of interest 0 which is, itself, in the center of the MRI apparatus 1, the second length L2 of the latter being, for example, two meters: the first and second longitudinal shims D1, D2 have equal lengths L3, L4, of 0.845 meters each, i.e. the addition of the lengths L1, L3, L4 corresponds to the second length L2 of the opening C1; if the position of the magnetic bar A1 has to be off-centered with respect to the center of interest 0, closer to the first end 9 of the opening C1, for example, the length L3 of the first longitudinal shim D1 is diminished and the length L4 of the second longitudinal shim D2 is increased.

According to another characteristic of the invention, the correction device 10 has a plurality of openings C1, C2, ..., Cn, which are similar to the first opening C1 and are made by construction like this latter opening during the assembling of the MRI apparatus 1. It should be noted that it is relatively easy to set aside locations designed for the openings C1, ..., Cn in placing, at these locations, sheaths or tubes made of non-magnetic material, for example fiber glass. The openings C1, ... Cn are arranged symmetrically in one and the same circle with a radius r, around the axis Z of the magnet, and have longitudinal axes 30 parallel to the latter. Each of these openings C1 to Cn may or may not have a magnetic bar A1, under the same conditions as those described with respect to the first opening C1 i.e. for each magnetic bar placed in one of these openings C1 to Cn, a set of longitudinal shims is used, similar to the longitudinal shims D1, D2, and it is possible to use radial shims 20 adapted to the diameter d1 of the magnetic bar when the latter has a first diameter d1 smaller than the second diameter d2 of the opening C1, ..., Cn used.

In the non-restrictive example of the description, the openings C to Cn are placed at pre-determined angular positions P1, ..., Pn distributed around the axis Z of the magnet at angles $\alpha$ of 30°, i.e. 12 openings have thus been made. However, in the spirit of the invention, the number of these openings may be different, as also their angular position P1 to Pn and their distance from the axis Z of the magnet represented by the radius r.

The magnetic field $B_O$ having been measured in a manner known per se, the non-homogeneities of the field $B_O$ may be corrected by one or more magnetic bars A1, ..., An the number N of which is limited solely by that of the openings C1 to Cn. After having determined, either by tests or by means of a software program applying standard computations, for each magnetic bar, its angular position P1 to Pn corresponding to one of the openings C1 to Cn, its length L1, its cross section S1 and its longitudinal position along the axis Z of the magnet, each magnetic bar is positioned in the opening C1 assigned to it, and the number of magnetic bars could be smaller than that of the openings.

This arrangement of the correction device 10 according to the invention enables application of the principle of correction of the non-homogeneities of the field $B_O$ by one or more magnetic bars or magnetic elements A1, AN far more simply and quickly than in the prior art, notably through the existence of the pre-machined openings C1 to Cn, and through the use of the longitudinal shims D1, D2 and the radial shims 20 which facilitate the precise positioning of the magnetic bars A1, .. ., AN. It must be noted that the setting and the computations are considerably simplified because the longitudinal axis 8 of a magnetic bar A1, AN always keeps one and the same known position irrespectively of the dimension of the cross section S1 of the magnetic bar, this known position being that of the longitudinal axis 30 of the opening C1 to Cn in which the magnetic bar is engaged.

According to another characteristic of the invention, the length L1 of each magnetic bar A1, AN can be formed by two or more magnetic sections, placed end to end, as shown in FIG. 2, in order to facilitate, in practice, the adjustments made on the installation site.

FIG. 2 shows the MRI apparatus in a longitudinal sectional view along the axis Z of the magnet, and shows in a sectional view, as an example, the second opening C2 and the eigth opening C8 which are shown in FIG. 1 and are opposite with respect to the axis Z of the magnet.

The second and eighth openings C2, C8 are formed by the interior of a tube 50, and respectively contain a second magnetic bar and a third magnetic bar A2, A3, each placed between a first longitudinal shim and a second longitudinal shim D1, D2. The length L1 required for the second bar A2 may be obtained by a magnetic bar cut as a single piece or, as in the non-restrictive example shown in FIG. 2, by several magnetic sections a1, a2, a3, placed end to end so as to form a single magnetic bar A2 having the desired length L1. The first, second and third sections a1, a2, a3 may have one and the same length or, as in the example of FIG. 2, they may have different elementary lengths 11, 12, 13, for example 6, 10 and 15 cm. It is thus possible to make magnetic bars of different lengths in combining sections a1, a2, a3 ..., an having pre-determined elementary lengths 11, 12, ..., ln. This may exist for each section S1 value that may be had by a magnetic bar A1, A2, A3, . . ., AN, so that an operator responsible for the setting can easily have the necessary parts available. Furthermore, in the most common example, where the position and dimension of the magnetic bars A1 to AN are determined by means of a computation program, which takes into account the pre-determined angular position P1 to Pn of the existing openings C1 to Cn, this program can also take into account the value of the different elementary lengths 11, 12, 13, ..., ln, as well as the different values of the section S1 or first diameter d1 in which these sections a1 to an are available. It must be noted that this first diameter d1 may vary in steps of 1 mm until the maximum diameter which corresponds to the second diameter d2 of an opening C1 to Cn and may reach, for example, 15 mm.

According to another characteristic of the invention, a magnetic bar may be formed by one or more separate magnetic sections, as shown in FIG. 2 by the third magnetic bar A3 contained in the eighth opening C8. In the non-restrictive example described, the third magnetic bar A3 is formed by a fourth magnetic section and a fifth magnetic section, a4, a5, separated by a separating shim 40, with which they form a set, the total length Lt of which is centered with respect to the center of interest 0. However, to obtain the desired correction, the third magnetic bar A3 may also be formed by a greater number of magnetic sections a1, a2, a3, a4, a5., ..., an separated by one or more separating shims 40, and further forming a set, the length Lt of which may be off-centered with respect to the center of interest 0. The separating shims 40, as well as the longitudinal shims D1, D2, are made of fiber glass or of any other materials that exert no influence on a magnetic field.

The correction device 10 according to the invention thus enables the use of any number N of magnetic bars A, A2, . . . , AN of varied composition, this number being limited by the number of openings C1 to Cn.

Although it has been described with reference to the magnet 2 of a nuclear magnetic resonance imaging apparatus, of the type used in medicine, and in which several correction magnetic bars are generally necessary, the correction device 10 according to the invention can also be applied to the case of magnets of a different type. In particular, it is possible to use the arrangement of the correction device of the invention by placing one or more magnetic bars outside a magnet, in which case the magnetic bars are formed not by magnetizable parts (made of soft iron) but by parts that have been previously and permanently magnetized, and are made of a material for permanent magnets, namely a hard magnetic material (an alloy of rare earths and cobalt for example).

I claim:

1. A device for the correction of non-homogeneities of a magnetic field ($B_O$) in a magnet, comprising at least one magnetic element, the length and cross section of which are defined according to the correction to be made, said magnetic element being contained in a first opening formed in a support located in the vicinity of the field to be corrected, characterized in that the opening is formed in the support by a location reserved during the construction of the support, the opening having a length and a cross section greater than, respectively, the maximum length and the maximum cross section of the magnetic element, and in that it further comprises means disposed in said opening to keep the longitudinal axis of the magnetic element substantially identical with the longitudinal axis of the opening.

2. Correction device according to claim 1, characterized in that it comprises a plurality of openings similar to the first opening and pre-machined.

3. Device according to claim 2, characterized in that the number of magnetic elements is equal to or smaller than the total number of openings.

4. Correction device according to claim 1, characterized in that the means to keep the two longitudinal axes substantially identical include at least one radial shim having an axial opening in which there is engaged a magnetic element and which has a cross section that is substantially the same as that of the cross section of the magnetic element.

5. Correction device according to claim 4, characterized in that it further comprises at least first and second longitudinal shims between which said magnetic element is contained in said first opening, the addition of the lengths of said longitudinal shims with the length of said magnetic element corresponding to the length of said first opening.

6. Correction device according to claim 5, characterized in that the first and second longitudinal shims have equal or different lengths depending on the position of a magnetic element along the longitudinal axis of an opening.

7. Correction device according to claim 1, characterized in that said magnetic element is formed by at least two magnetic sections joined end-to-end.

8. Correction device according to claim 7, characterized in that the length of a magnetic element is obtained by the addition of magnetic sections having different elementary lengths.

9. Correction device according to claim 7, characterized in that a magnetic element is formed by at least two magnetic sections separated by a separating shim made of magnetic material.

10. Correction device according to claim 1, characterized in that the magnet has the shape of a circular cylinder, and in that the longitudinal axis of the at least one opening is parallel to an axis of the magnet.

11. Correction device according to claim 10, characterized in that the openings and the magnetic elements are arranged inside the magnet.

12. Correction device according to claim 10, characterized in that the openings are arranged around the axis of the magnet in pre-determined angular positions.

13. Correction device according to one of the claims 1 to 4, characterized in that the at least one magnetic element is made of soft magnetic material.

14. Correction device according to claim 13, characterized in that the magnetic elements are made of soft iron.

15. Correction device according to claim 13, characterized in that the magnetic elements are made of soft ferrite.

16. Correction device according to one of claims 1 to 4, characterized in that the at least one magnetic element is made of hard magnetic material, previously and permanently magnetized.

17. Correction device according to claim 1, wherein the magnet constitutes the magnet of a nuclear magnetic resonance imaging apparatus.

* * * * *